(12) United States Patent
Osawa

(10) Patent No.: US 6,259,061 B1
(45) Date of Patent: Jul. 10, 2001

(54) VERTICAL-HEAT-TREATMENT APPARATUS WITH MOVABLE LID AND COMPENSATION HEATER MOVABLE THEREWITH

(75) Inventor: Tetsu Osawa, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/150,303

(22) Filed: Sep. 9, 1998

(30) Foreign Application Priority Data

Sep. 18, 1997 (JP) .................................................. 9-272072

(51) Int. Cl.$^7$ ...................................................... H01L 21/22
(52) U.S. Cl. ........................ 219/390; 219/411; 392/416; 392/418; 118/724; 118/729
(58) Field of Search ................................ 219/390, 405, 219/411; 392/416, 418; 118/724, 725, 50.1, 728, 730, 729

(56) References Cited

U.S. PATENT DOCUMENTS

| 4,943,234 | * | 7/1990 | Sohlbrand | 432/152 |
| 4,950,870 | * | 8/1990 | Mitsuhashi et al. | 219/390 |
| 5,329,095 | * | 7/1994 | Okase | 219/390 |
| 5,332,442 | * | 7/1994 | Kubodera et al. | 118/725 |
| 5,525,160 | * | 6/1996 | Tanaka et al. | 118/728 |
| 5,683,518 | * | 11/1997 | Moore et al. | 118/730 |
| 5,763,856 | * | 6/1998 | Ohkase | 219/390 |

FOREIGN PATENT DOCUMENTS

| 58-40824 | * | 3/1983 | (JP) . | |
| 60-95917 | * | 5/1985 | (JP) . | |
| 63-79313 | * | 4/1988 | (JP) . | |
| 2-42311 | | 3/1990 | (JP) . | |
| 2-218117 | * | 8/1990 | (JP) | 219/390 |
| 2-134542 | | 11/1990 | (JP) . | |
| 2-150754 | | 12/1990 | (JP) . | |
| 4-162712 | * | 6/1992 | (JP) . | |
| 5-47686 | * | 2/1993 | (JP) . | |
| 6-208954 | | 7/1994 | (JP) . | |
| 7-6976 | | 1/1995 | (JP) . | |

* cited by examiner

*Primary Examiner*—John A. Jeffery
(74) *Attorney, Agent, or Firm*—Oblon, Spivak, McClelland, Maier & Neustadt, P.C.

(57) ABSTRACT

A vertical-heat-treatment apparatus for semiconductor wafers has a compensation heater disposed under a lid for opening and closing a port at the bottom of a process chamber. The compensation heater heats the semiconductor wafers on a wafer boat from below through a window arranged on the lid. The compensation heater has seven heating lamps attached to a fixed base, which is vertically moved along with the lid, and rotatable reflection mirrors respectively surrounding the lamps.

17 Claims, 10 Drawing Sheets

VERTICAL-HEAT-TREATMENT APPARATUS WITH MOVABLE LID AND COMPENSATION HEATER MOVABLE THEREWITH

BACKGROUND OF THE INVENTION

The present invention relates to a vertical-heat-treatment apparatus for heat-treating a plurality of target substrates, such as semiconductor wafers, all together in a semiconductor processing system. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

Figure 9:
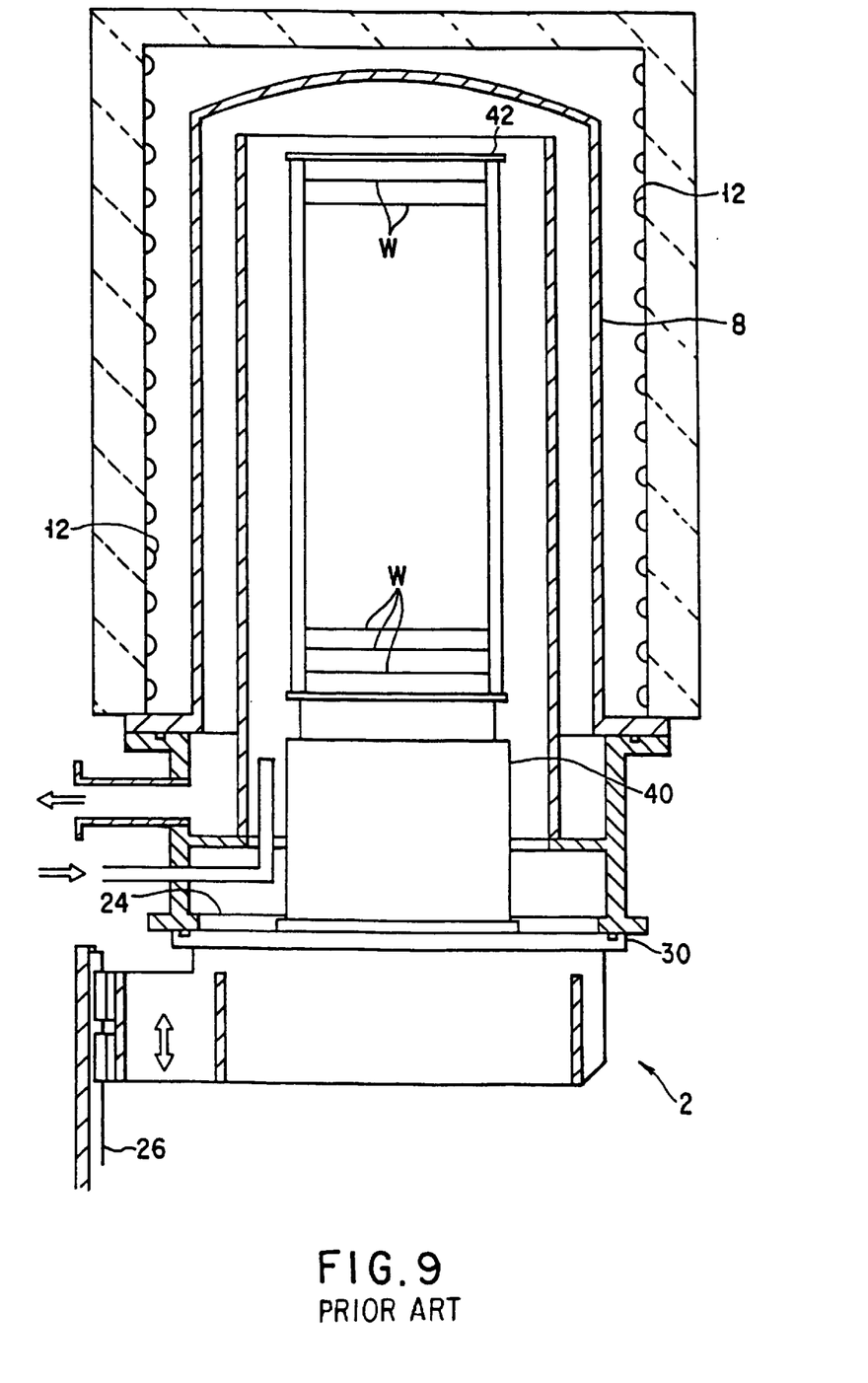
FIG. 9 is a cross-sectional view showing a vertical heat-treatment apparatus of a related art.

Vertical-heat-treatment apparatuses are known as apparatuses for subjecting a number of semiconductor wafers to a predetermined heat treatment all together. FIG. 9 is a cross-sectional view showing a vertical-heat-treatment apparatus 2 of related arts.

In the heat treatment apparatus 2, wafers W are vertically stacked with gaps therebetween on a wafer boat 42 of quartz, and then the boat is loaded into a vertical process chamber 8, so that the wafers are sequentially heat-treated. Since the wafers W have to be maintained at a high process temperature, the wafer boat 42 is loaded in the process chamber 8 while it is mounted on a lid 30 through an insulating cylinder 40 of quartz having a heat-insulating property.

More specifically, when the wafers W are loaded in the process chamber, they are first stacked on the wafer boat 42. Then, the wafer boat 42 is mounted on the insulating cylinder 40, and is moved up therewith into the process chamber 8 through an opening 24 by activating an elevating mechanism 26. Then, the opening 24 is airtightly closed by the lid 30.

The wafers W on the wafer boat 42 are heated and kept at a predetermined process temperature by a main heater 12 arranged around the process chamber 8. However, since the opening 24 for the wafer boat 42 should not be heated to a high temperature, the heat-insulating cylinder 40 is used. A temperature gradient is formed in the insulating cylinder 40, such that the temperature gradually decreases from the process temperature to the temperature of the opening 24.

The insulating cylinder 40 has a thermal capacity larger than the wafers W and requires a long time to be heated and become thermally stable. For this reason, the process cannot be started until the insulating cylinder 40 has a stable temperature, thereby lowering the throughput. The period of time, until the process chamber becomes thermally stable at the predetermined temperature, is called a temperature recovering time.

During the process, the insulating cylinder 40 has a stable temperature between the process temperature and the temperature of the opening 24. The insulating cylinder 40 hardly faces any part of the main heater 12, and thus is supplied with a flow of heat less than that to the wafers W. Consequently, it takes a long time for the insulating cylinder 40 and the lower wafers to become thermally stable. Further, the lower wafers are thermally affected by the insulating cylinder 40.

In order to solve these problems, several dummy wafers, which are different from wafers to be processed, may be mounted on the lower levels of the wafer boat. Even this method, however, is not sufficient to solve the problems, i.e., a long period of time up to attainment of thermal stability and a thermal ill-effect on the lower wafers.

BRIEF SUMMARY OF THE INVENTION

It is an object of the present invention to provide a vertical-heat-treatment apparatus in a semiconductor processing system, which can shorten the heating time necessary for target substrates to achieve a stable temperature.

It is another object of the present invention to provide a vertical-heat-treatment apparatus in a semiconductor processing system, which can present a high thermal uniformity in the vertical direction within a process chamber.

According to a first aspect of the present invention, there is provided a vertical-heat-treatment apparatus for heat-treating a plurality of target substrates all together in a semiconductor processing system. The apparatus comprises a process chamber for receiving the target substrates, the process chamber having a port at its bottom end; a lid for opening and closing the port; a holder for holding the target substrates to be vertically stacked with gaps therebetween in the process chamber, the holder being loaded and unloaded into and from the process chamber through the port; a main heater disposed around the process chamber, for heating an atmosphere in the process chamber through a side wall of the process chamber; and a compensation heater disposed under the lid, for heating the target substrates on the holder from below through the lid.

According to a second aspect of the present invention, there is provided a vertical-heat-treatment apparatus for heat-treating a plurality of semiconductor wafers all together. The apparatus comprises a process chamber for receiving the wafers, the process chamber having a port at its bottom end; a lid for opening and closing the port; a holder for holding the wafers to be vertically stacked with gaps therebetween in the process chamber, the holder being loaded and unloaded into and from the process chamber through the port, while being supported by the lid; an elevating mechanism for vertically moving the lid along with the holder; a supply mechanism for supplying a process gas into the process chamber; an exhaust mechanism for exhausting and setting the process chamber at a vacuum; a main heater disposed around the process chamber, for heating an atmosphere in the process chamber through a side wall of the process chamber; and a compensation heater disposed under the lid, for heating the wafers on the holder from below through the lid, the compensation heater being vertically moved along with the lid by the elevating mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

In the process of developing the present invention, the present inventor conducted experiments on the vertical-heat-treatment apparatus of a related art shown in FIG. 9, and found the following knowledge.

Figure 10:
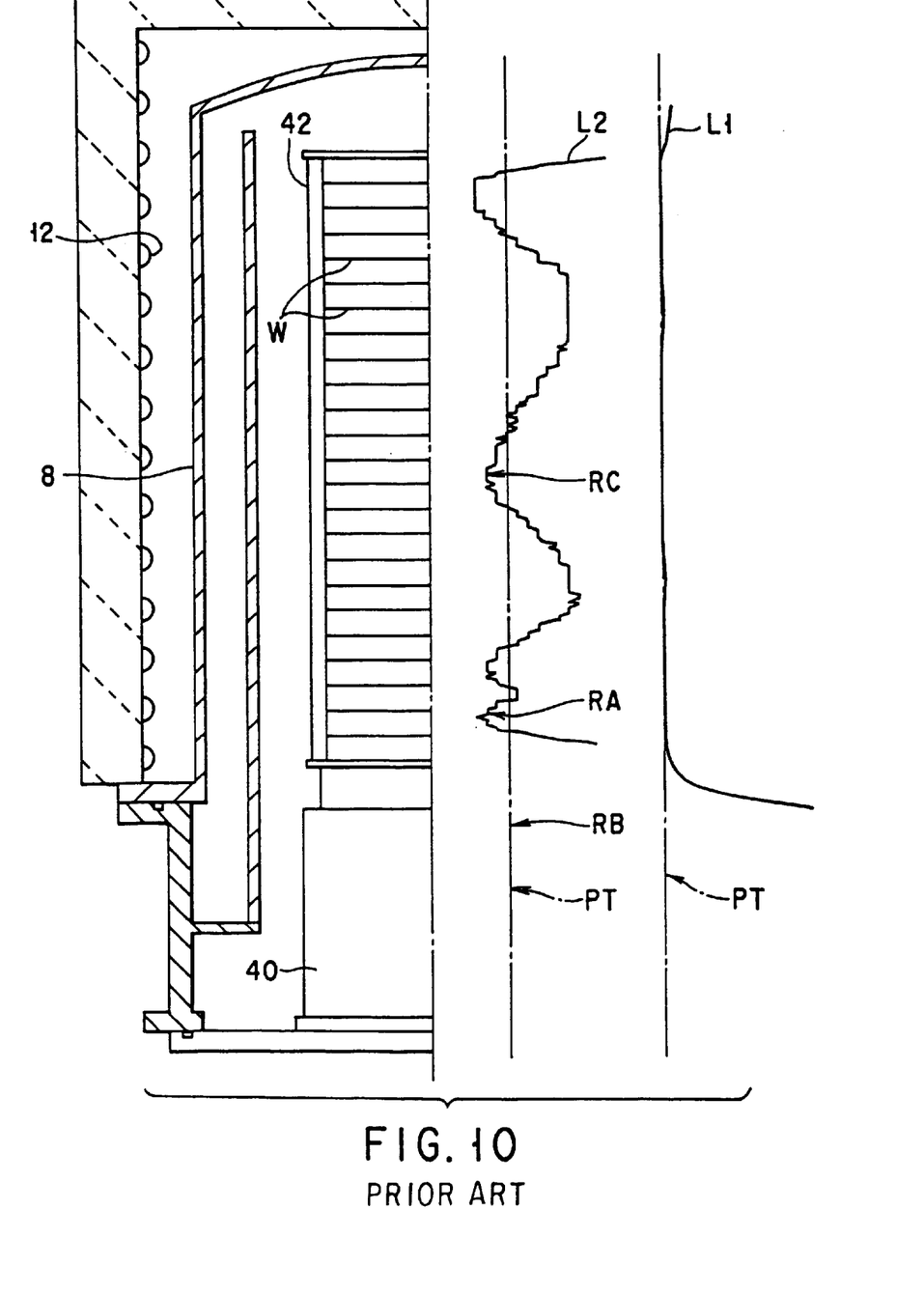
FIG. 10 is a view showing thermal distribution in the process chamber of the apparatus shown in FIG. 9.

FIG. 10 is a view showing thermal distribution in the process chamber 8 of the apparatus shown in FIG. 9, using as a reference a process temperature PT at a time when a thermally stability is attained. In FIG. 10, a line L1 indicates rough thermal distribution data while a line L2 indicates detailed thermal distribution data. These data shown in FIG. 10 are obtained when control parameters are essentially optimized.

Temperature differences appearing in the detailed thermal distribution of the line L2 determine thermal uniformity among wafers, i.e., inter-plane uniformity or vertical uniformity of temperature, which is an object to improve with struggle. In FIG. 10, a domain RA is set to have a temperature higher than that in its neighboring area. By setting the domain RA at a high temperature, a domain RC is prevented from being affected by a domain RB which has a lower temperature. The temperature of the domain RA is determined by the inflow of heat from above which depends on the temperature difference between the domains RA and RC and heat transmission rate; the radiation of heat from the lateral sides; the downward outflow of heat which depends on the temperature difference between the domains RA and RB and heat transmission rate; and the thermal capacity of the domain RA.

Among them, the temperature of the domain RB, which is low, is the dominant factor. In other words, control parameters for the domain RA should be set to compensate for the outflow of heat to the domain RB, which has a large temperature difference from the domain RA, while suppressing thermal influences, to the minimum, to the domain RC, which has a small temperature difference from the domain RA. Since the temperature of the domain RB is far lower than that of the domain RC, the domain RA requires a large amount of heat to be supplied. However, it is preferable to make the domain RA as narrow as possible.

For the reason described above, there is a problem that the domain RA may be supplied with an excessive input. Further, setting of the control parameters is so delicate that operators are required to be skilled. In addition, even if the control parameters are optimally set, some influence on the important domain RC still exists. This is due to the domain RB having a low temperature.

There is another important performance of the apparatus to be considered, i.e., planar uniformity which is defined by uniformity of temperature on each wafer. Namely, the apparatus has to satisfy both demands in the inter-plane uniformity (in the vertical direction) and the planar uniformity (in the horizontal direction). Even at the both ends of the wafer boat 42, where a good inter-plane uniformity is not guaranteed, the planar uniformity has to be guaranteed and preferably improved.

The planar uniformity on wafers at the both ends of the wafer boat is greatly influenced by the planar uniformity on substances next to them. In the apparatus shown in FIG. 9, which employs the insulating cylinder 40, the planar uniformity on the wafer at the bottom of the wafer boat is determined by the temperature distribution on the top of the insulating cylinder. On the other hand, the temperature of the insulating cylinder is determined by the inflow of heat supplied from around and the outflow of heat downward. For this reason, the apparatus shown in FIG. 9 is considered to have no means of guaranteeing the planer uniformity.

The present invention has been made on the basis of the above described knowledge. An explanation will be given on embodiments of the present invention with reference to the drawings.

In the following description, the same reference numerals denote constituting elements having nearly the same functions and arrangements, and a repetitive description will be made only when it is necessary.

Figure 1:
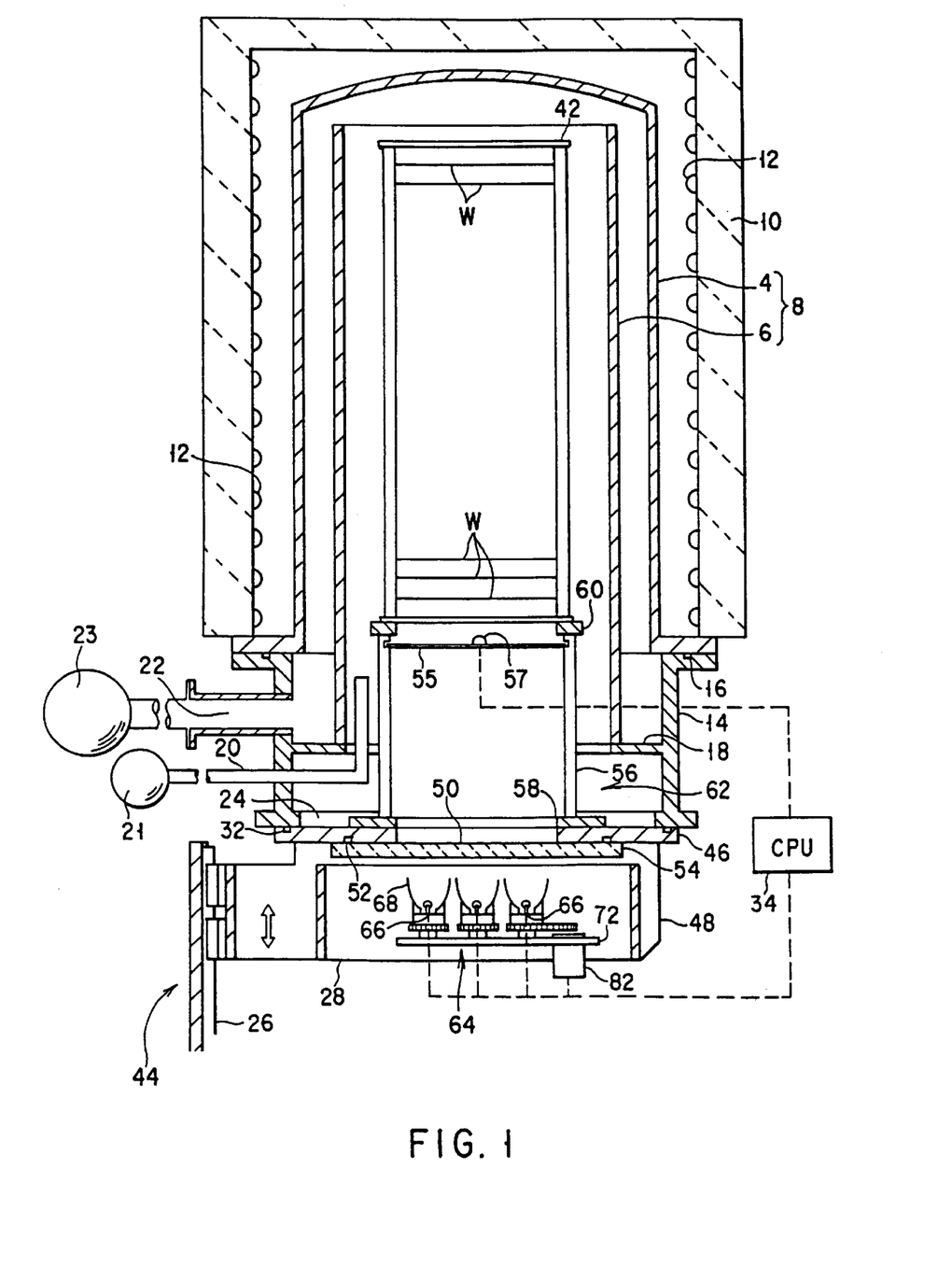
FIG. 1 is a vertically cross-sectional side view showing a vertical-heat-treatment apparatus according to an embodiment of the present invention.

FIG. 1 is a vertically cross-sectional side view showing a vertical-heat-treatment apparatus 44 according to an embodiment of the present invention.

The vertical-heat-treatment apparatus 44 has a process chamber 8 for receiving semiconductor wafers W along with a wafer boat 42. The process chamber 8 is formed of a circular outer tube 4 of quartz having a ceiling, and a circular inner tube 6 of quartz concentrically arranged in the outer tube 4. The process chamber 8 is covered with an insulating casing 10, and a main heater 12 formed of a resistance heating coil is arranged inside the insulating casing 10 for heating the wafers W.

The bottom of the process chamber 8 is connected to a manifold 14 of stainless steel through a sealing member 16, such as an O-ring. The manifold 14 has a support project 18 extending inward from its inside and supporting the bottom of the inner tube 6 thereon.

The manifold 14 is provided with a gas feed nozzle 20, which penetrates therethrough to extend into the inner tube, and is, in return, connected to a process gas source 21. The manifold 14 is also provided with an exhaust port 22 which communicates with a space between the inner and outer tubes 6 and 4. The exhaust port 22 is connected to a vacuum pump 23 for exhausting and setting the process chamber 8 at a vacuum.

There is an opening 24, i.e., the port of process chamber 8, at the bottom of the manifold 14. The opening 24 is opened and closed by a lid 46 of stainless steel. The lid 46 is attached to an arm 28 which extends from an elevating mechanism 26, such as a boat elevator. The lid 46 is provided therearound with a sealing member 32, such as an O-ring 32, for ensuring airtightness of the process chamber 8 when the opening 24 is closed.

More specifically, the lid 46 is connected to the arm 28 of the elevating mechanism 28 by a rectangular support frame 48. The lid 46 has a circular opening 50 at the center, which has a diameter almost the same as or slightly larger than that of the wafers. A heat-ray transmission window 54 of transparent quartz is airtightly attached to the opening 50 by a sealing member 52, such as an O-ring.

Figure 2:
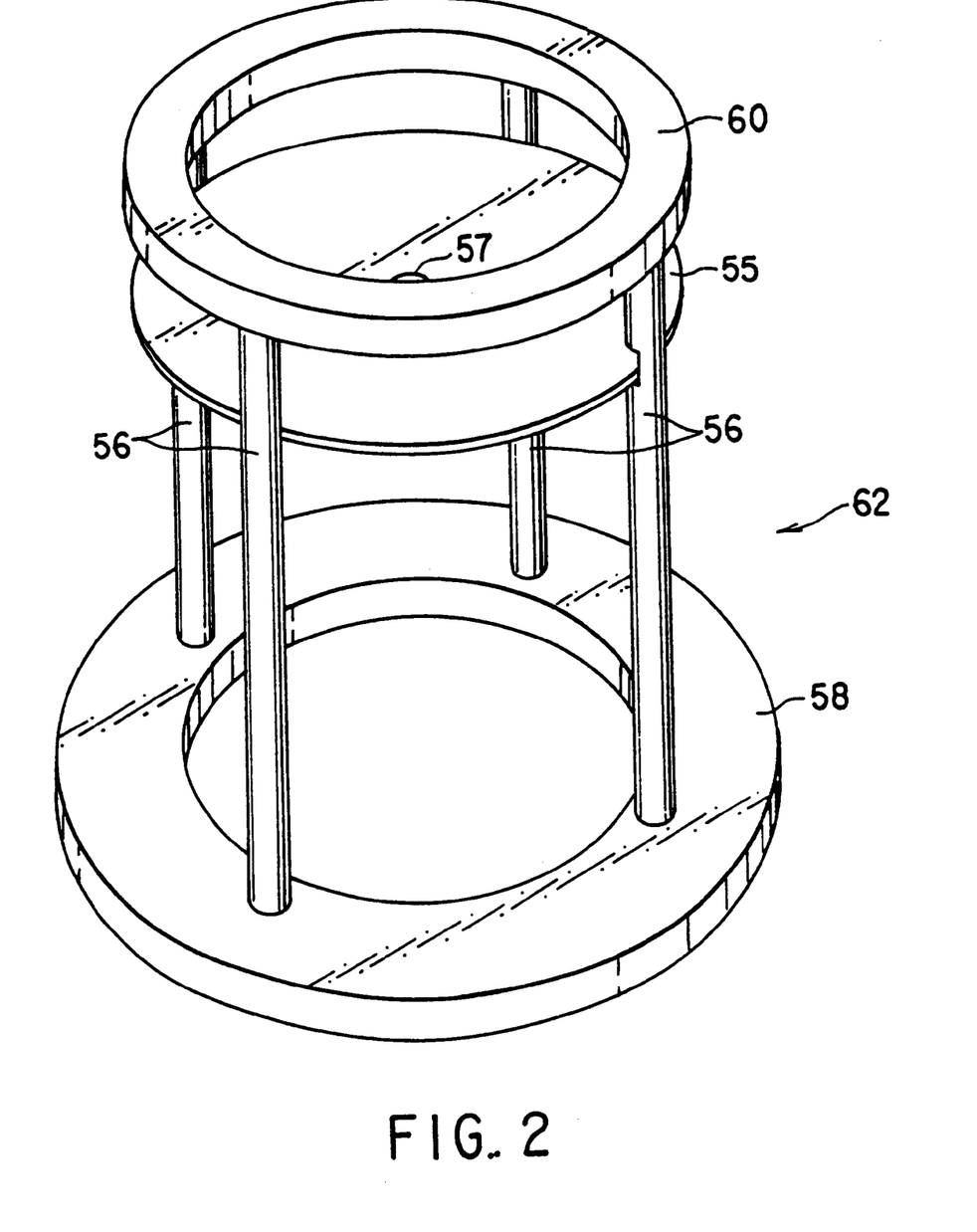
FIG. 2 is a perspective view showing a support stand used in the apparatus shown in FIG. 1.

A support stand 62 is arranged on the lid 46 to support the wafer boat 42 for holding a number of wafers W. As shown in FIG. 2, the support stand 62 has a plurality of, i.e., four, support legs 56 of quartz; a bottom ring 58 of quartz connected to the bottom ends of the support legs 56; and a top ring 60 of quartz connected to the top ends of the support legs 56. The wafer boat 42 is mounted on the top ring 60 of the support stand 62. The number of the support legs 56 may be three, or five or more. The bottom ring 58 has an inner diameter the same as or slightly larger than that of the opening 50 formed in the lid 46. Consequently, the weight of the bottom ring 58 is not supported by the window 54 but by the lid 46.

The support legs 56 are provided near their tops with grooves, respectively, and a thermal-buffer plate 55 of transparent quartz, which is as thin as 0.5 to 2 mm and has a small thermal capacity, is attached in the grooves. The thermal-buffer plate 55 contributes to a high planar uniformity of the temperature on the lower wafers W, by preventing the wafers W from being directly irradiated with light from a compensation heater 64 for compensating for heat in the lower part of the process chamber 8, as described later. A thermometer 57 is attached at the center of the thermal-buffer plate 55, for detecting temperature. The temperature measured by the thermometer 57 is read by a control section (CPU) 34, which controls the heating power of the compensation heater 64 on the basis of the measured temperature.

Figure 3:
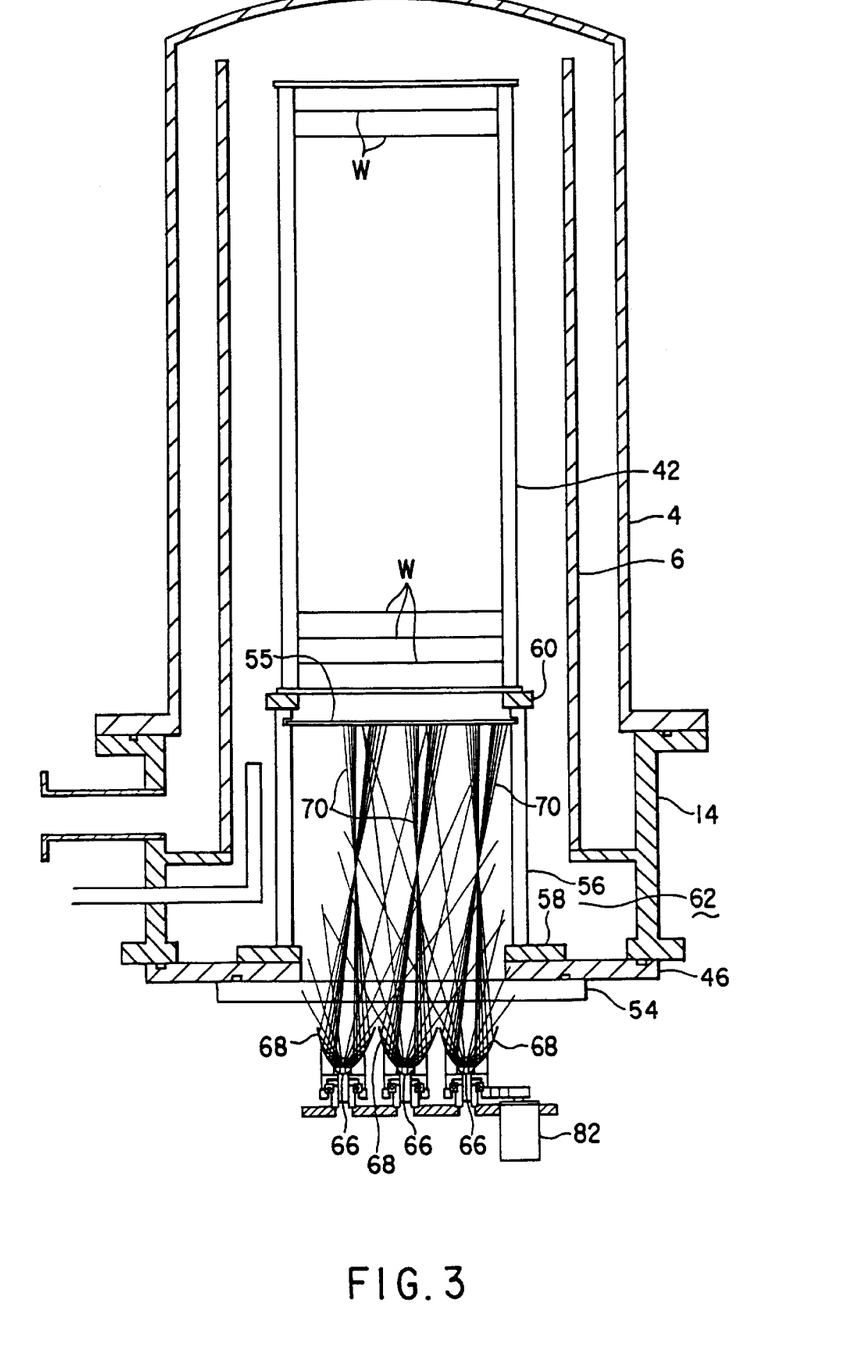
FIG. 3 is a vertically cross-sectional side view showing a manner of heating the lower part of the apparatus shown in FIG. 1.

The compensation heater 64 is attached to the support frame 48 supporting the lid 46 right under the window 54. More specifically, the compensation heater 64 has a plurality of, for example, seven, heating lamps 66 at the center and positions annularly arranged therearound. Each lamp 66 is surrounded by a reflection mirror 68 having an elliptic or parabolic shape in section along the optical axis direction and directed upward. Heat rays from the lamp 66 are reflected upward by the reflection mirror 68, as shown in FIG. 3.

Figure 4:
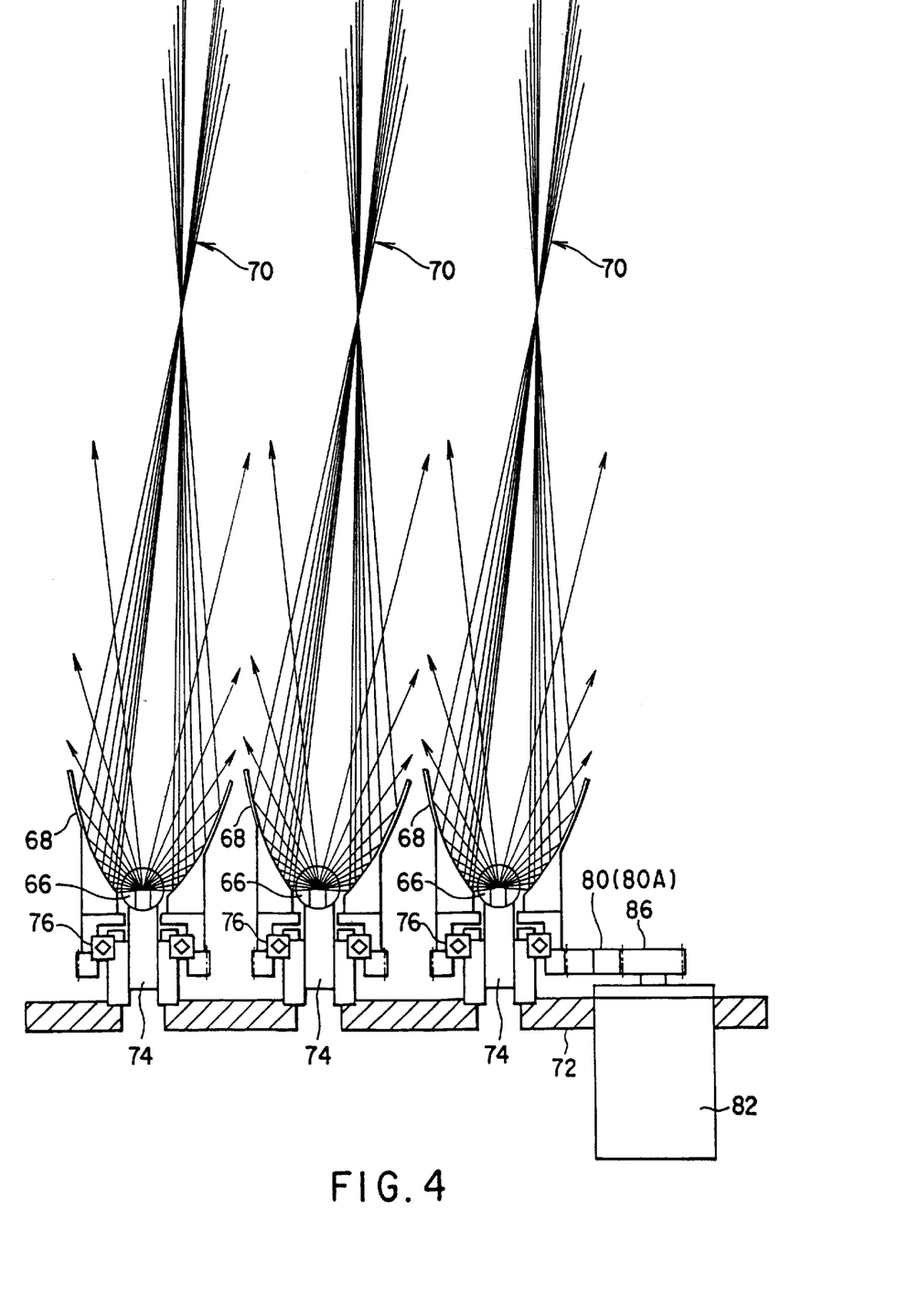
FIG. 4 is a vertically cross-sectional side view showing heating lamps used as a compensation heater in the apparatus shown in FIG. 1.

The seven reflection mirrors 68 have the optical axes inclined from the vertical direction, so that their reflection directions are oriented toward different positions on the bottom surface of the thermal-buffer plate 55, and totally uniformly distributed. The seven reflection mirrors 68 are rotatable about the center of the respective lamps 66, such that they have vertical rotational axes. Where each reflection mirror 68 has an elliptic shape, its focal point is set at a position slightly before the thermal-buffer plate 66 as the radiation target. FIGS. 3 and 4 show the state of the heat rays 70 radiated from the lamps 66, where each reflection mirror 68 has an elliptic shape. As the lamps 66, for example, halogen lamps may be used.

Each of the lamps 66 is arranged at the top of a fixed shaft 74 which vertically stands from a fixed base 72 attached to the support frame 48. The lamps 66 can be individually controlled over their heating power.

Figure 5:
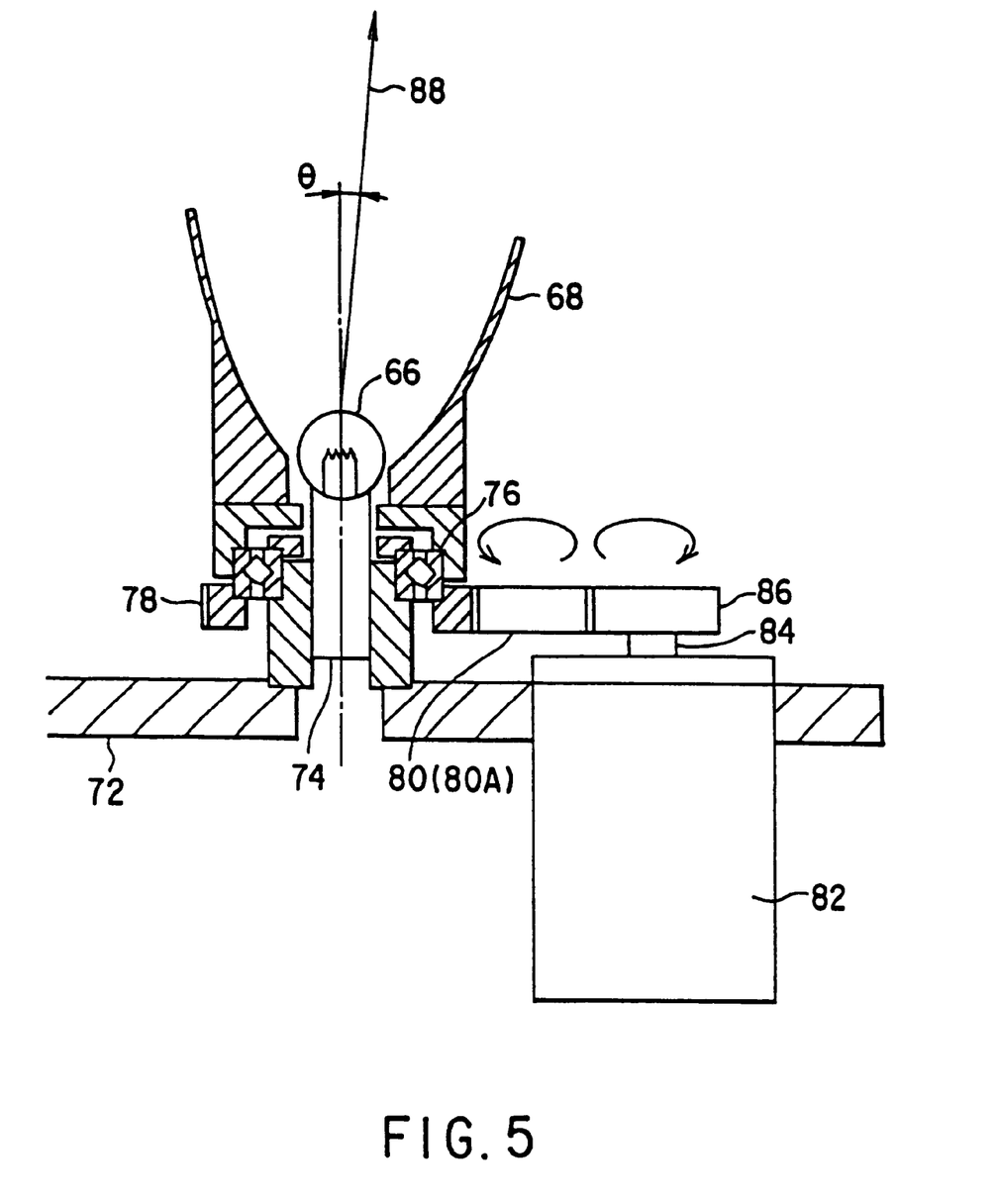
FIG. 5 is an enlarged cross-sectional view showing one of the heating lamps and a reflection mirror used in the apparatus shown in FIG. 1.
Figure 6:
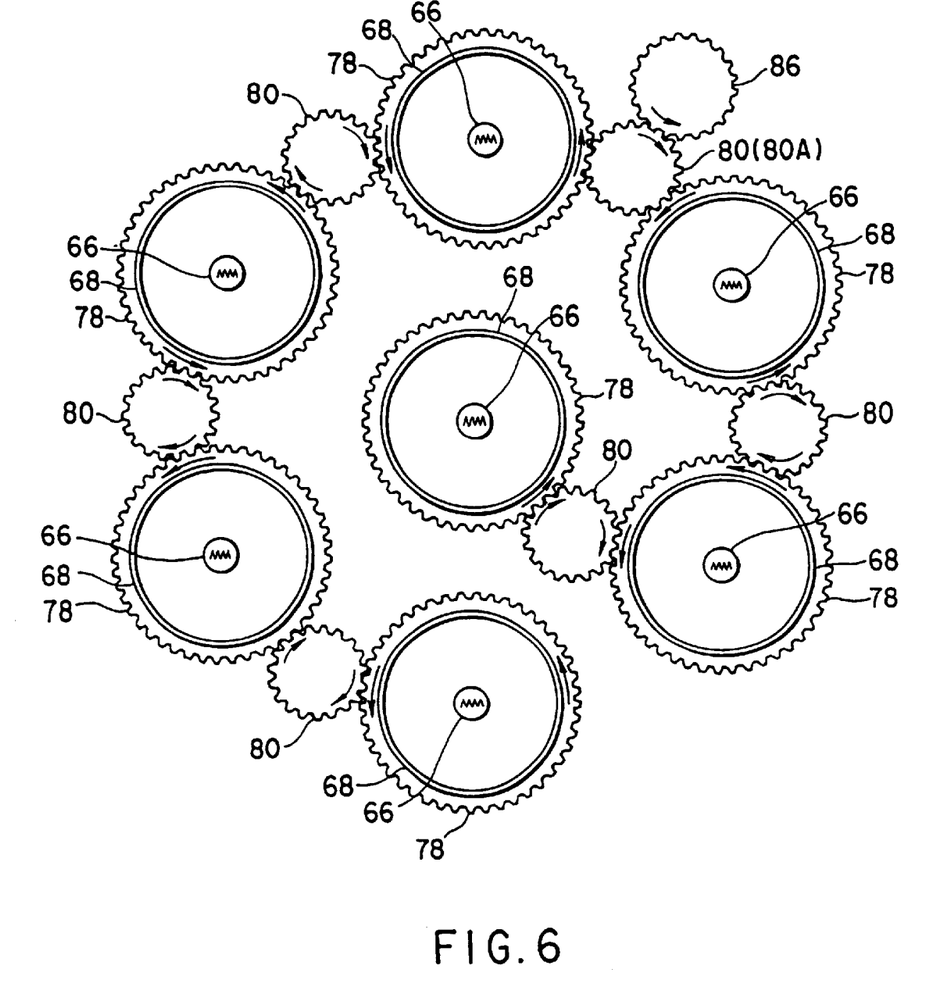
FIG. 6 is a plan view showing the heating lamps and the reflection mirrors used in the apparatus shown in FIG. 1.

The bottom 68 of each reflection mirror 68 is rotatably supported on the fixed shaft 74 by a bearing 76, as shown in FIGS. 4 and 5. Each reflection mirror 68 is provided at its bottom with a rotational gear 78 having a large diameter, as shown in FIG. 5 and 6. Among the gears 78, auxiliary gears 80 having a small diameter are arranged to mesh with the gears 78. One 80A of the auxiliary gears 80 meshes with a driving gear 86 attached to a driving shaft 84 of a driving motor 84, as shown in FIG. 5. Consequently, when the driving gear 86 rotates, this rotational force is transmitted through the auxiliary gears 80 and the rotational gears 78 alternately, thereby rotating all the reflection mirrors 68 at the same time.

An explanation will be given on an operation of the vertical heat-treatment apparatus 44.

A number of untreated wafers W are vertically stacked with gaps therebetween in the wafer boat 42. At this time, the wafer boat 42 is supported on the lid 46 by the support stand 62, at an unload position under the process chamber 8.

Then, the elevating mechanism 26 is activated to move the arm 28 upward, and to load the wafer boat 42 into the process chamber 8 through the opening 24 of the manifold 14 arranged at the bottom of the process chamber 8. Subsequently, the opening 24 is airtightly closed by the lid 46, and the process chamber 8 is vacuum-exhausted and is supplied with a process gas. On the other hand, the process chamber 8 is heated by the main heater 12 and the compensation heater 64 so that the inside atmosphere of the process chamber 8 has a predetermined temperature. In this heating, the main heater 12 and the compensation heater 64 are automatically controlled while the measured temperature in the process chamber 8 is being fed back. When temperatures at certain positions and the pressure in the process chamber satisfy predetermined conditions, the process is started.

During the heating and the process, the main heater 12 heats up the inside atmosphere of the process chamber 8 through the side wall of the process chamber 8. In addition, the compensation heater 64 heats the wafers W on the wafer boat 42 from directly below through the window 54 of the lid 46 and the thermal-buffer 55 of the support stand 62 having a small thermal capacity. In this heating, the seven reflection mirrors 68 of the compensation heater 64 are simultaneously rotated.

In other words, the vertical heat-treatment apparatus 44 is designed to heat the inside atmosphere of the process chamber 8 by means of cooperation of the main heater 12 and the compensation heater 64. Consequently, even where a process temperature is higher than that conventionally used, the inside atmosphere of the process chamber 8 can be swiftly heated up and set at the process temperature responsibly and stably.

The support stand 62 for supporting the wafer boat 42 has a hollow structure formed of the support legs 56, rings 58 and 60, and the thermal-buffer 55 having a small thermal capacity. Consequently, the support stand 62 has a thermal capacity far smaller than that of conventional insulating cylinders. As a result, the inside of the process chamber 8 can be heated up at a high speed, thereby improving the throughput.

The heat rays 70 emitted from the lamps 66 of the compensation heater 64 are reflected by the reflection mirrors 68 onto different positions on the bottoms surface of the thermal-buffer plate 55, so that the heat rays 70 are essentially uniformly distributed as a whole. As a result, the planar thermal uniformity on the thermal-buffer plate 55 is improved, and the planar thermal uniformity on the wafers W is also improved. If necessary, it is possible to concentrate heat on a local position in light of thermal distribution, thereby further improving and keeping the planar thermal uniformity on the thermal-buffer plate 55.

The reflection direction 88 of each reflection mirror 68 is set inclined by an angle θ relative to the vertically fixed shaft 74, as shown in FIG. 5. Consequently, the light spot formed by each lamp 66 is swingingly rotated along a small circle by rotation of the reflection mirror 68, thereby further improving the planar thermal uniformity on the wafers W placed at the lower levels.

Figure 7:
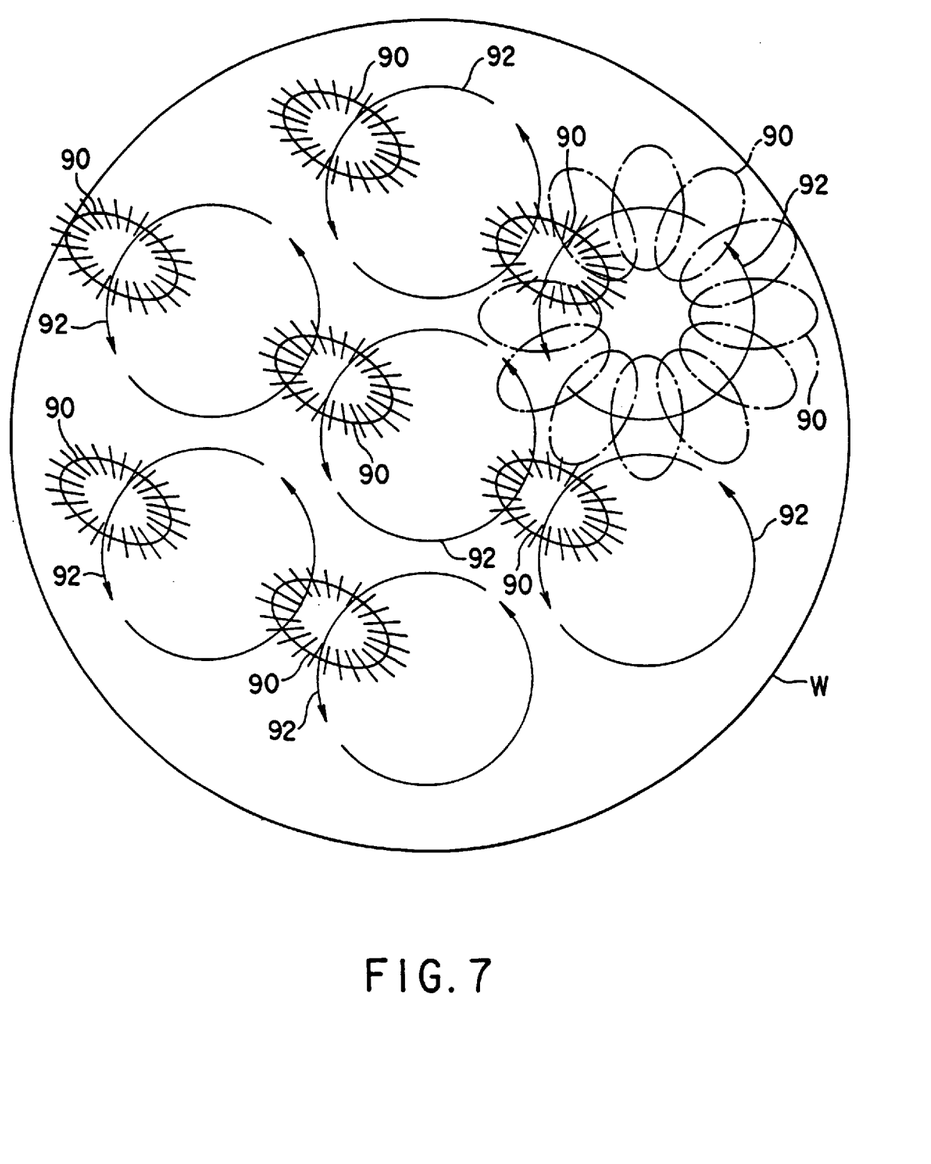
FIG. 7 is a view showing a manner of movement of light spots on the bottom side of a wafer placed at the bottom level of the wafer boat.

FIG. 7 is a view showing a manner of movement of the light spots on the bottom side of a wafer placed at the bottom level. In FIG. 7, reference symbols 90 indicate the light spots formed by the lamps 66 at a certain time. The center of each light spot 90 is moved along a locus 92 of a small circle by rotation of the reflection mirror 68. As shown in FIG. 7, all over the bottom surface of the wafer W is irradiated with the heat rays while the light spots 90 are moved along the respective circular loci 92, thereby improving the planar thermal uniformity on the wafer W, as described above.

The edge of the wafer W tends to discharge heat more than the center does. For this reason, positions near the edge of the thermal-buffer plate 55 may be supplied with heat amounts by the respectively light spots, larger than the heat amount supplied by the light spot at the center, thereby further improving the planar thermal uniformity.

Figure 8:
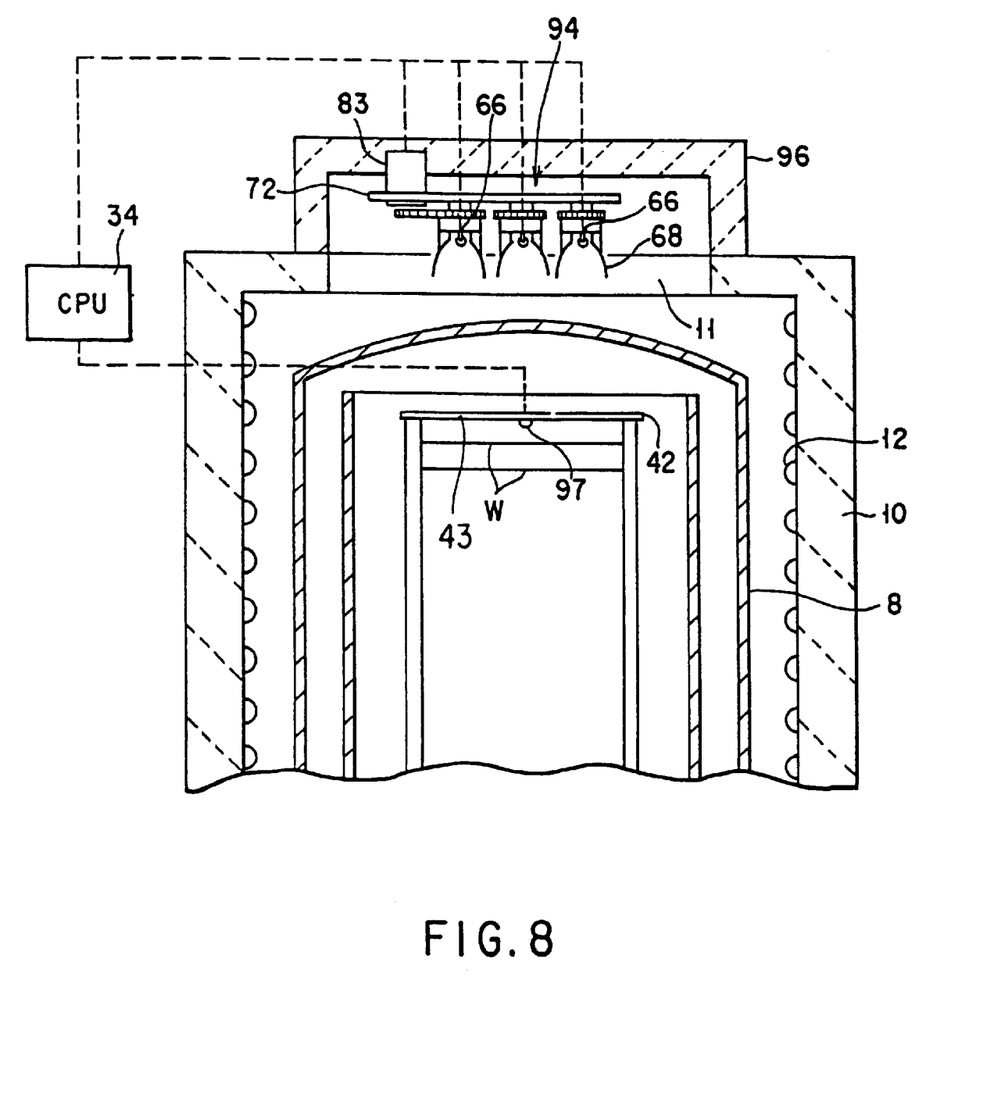
FIG. 8 is a vertically cross-sectional side view showing part of a modification of the apparatus shown in FIG. 1.

The apparatus shown in FIG. 1 is provided with the compensation heater 64 as a countermeasure for heat-discharge from the bottom of the wafer boat 42. On the other hand, heat is also discharged from the top of the wafer boat 42. For this reason, a compensation heater according to the present invention may be arranged above the wafer boat, thereby improving the vertical thermal uniformity. FIG. 8 is a vertically cross-sectional side view showing part of a modification of the apparatus shown in FIG. 1, in accordance with such an aspect.

In this modification, an opening 11 is formed at the top of an insulating casing 10 right above the process chamber 8, and a second compensation heater 94 is arranged at the opening 11. The second compensation heater 94 has the same structure as the compensation heater 64, i.e., has heating lamps 66 fixed to a fixed base and rotational reflection mirrors 68. The second compensation heater 94, however, is arranged to radiate light downward, though the compensation heater 64 is arranged to radiate light upward. The second compensation heater 94 is covered with an auxiliary insulating casing 96.

A wafer boat 42 has a top plate 43 of transparent quartz, which works for improving the planar thermal uniformity on the wafers W, as the thermal-buffer plate 55 does. A thermometer 97 is attached at the center of the top plate 43 for detecting temperature. The temperature measured by the thermometer 97 is read by a control section (CPU) 34, which controls the heating power of the second compensation heater 94 on the basis of the measured temperature.

In the modification shown in FIG. 8, during the heating and the process, the second compensation heater 94 heats up the wafers W on the wafer boat 42 from directly above through the ceiling of the process chamber 8 and the top plate of the boat 42. In this heating, the seven reflection mirrors 68 of the second compensation heater 94 are simultaneously rotated. In other words, this modification is designed to heat the inside atmosphere of the process chamber 8 by means of cooperation of the main heater 12, the compensation heater 64, and the second compensation heater 94. Consequently, even where a process temperature is higher than that conventionally used, the inside atmosphere of the process chamber 8 can be swiftly heated up and set at the process temperature reliably and stably.

Note that, the apparatus shown in FIG. 1 or 7 has the thermometer 57 arranged at the center of the thermal-buffer plate 55, so that the entire power of the lamps of the compensation heater 64 can be controlled. Instead, for example, thermometers may be arranged at positions corresponding to the center and the periphery, so that supplied power differs between the center and the periphery, thereby further improving the planar thermal uniformity. The number of the thermometers may be further increased, so that powers supplied to individual lamps can be controlled independently. Similarly, although the apparatus shown in FIG. 1 has the seven lamps 66, their number and arrangement are not limited to those of the embodiment. The rotation driving mechanism of the reflection mirrors is also not limited to that of the embodiment.

Further, the apparatus shown in FIG. 1 employs the thermal-buffer plate 55 to indirectly heat the wafers as objects to be heated. Instead, the bottom wafer on the wafer boat may be directly heated. In this case, it can be deemed that a conventional insulating cylinder is changed to a part of a wafer boat to form a prolonged wafer boat.

Furthermore, the apparatus shown in FIG. 1 has the process chamber of a double tube structure which is formed of the outer and inner tubes 4 and 6, and exhausted to a vacuum. However, the present invention can be applied to other vertical-heat-treatment apparatuses of a batch type, such as one having a process chamber of a single tube structure, and one having a process chamber which is not vacuum-exhausted.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A vertical-heat-treatment apparatus for heat-treating a plurality of target substrates all together in a semiconductor processing system, comprising:

a process chamber for receiving the target substrates, said process chamber having a port at its bottom end;

a lid for opening and closing said port, said lid being vertically moved to open and close said port, wherein a circular opening is formed at a center of said lid, said opening having a diameter slightly larger than that of the target substrates, a holder for holding the target substrates to be vertically stacked with gaps therebetween in said process chamber, said holder being loaded and unloaded into and from said process chamber through said port;

an elevating mechanism for vertically moving said lid along with said holder;

a main heater disposed around said process chamber, for heating an atmosphere in said process chamber through a side wall of said process chamber; and a compensation heater attached to said elevating mechanism and disposed below said lid, for heating the target substrates on said holder from below through said opening of said lid, said compensation heater being vertically moved along with said lid by said elevating mechanism.

2. An apparatus according to claim 1, further comprising a supply mechanism for supplying a process gas into said process chamber, and an exhaust mechanism for exhausting and setting said process chamber at a vacuum.

3. An apparatus according to claim 1, wherein said holder is supported by said lid when said holder is loaded in said process chamber.

4. An apparatus according to claim 1, wherein said holder comprises a boat for supporting the target substrates and a support stand for supporting said boat on said lid, said boat and support stand being separable from each other.

5. An apparatus according to claim 4, wherein said support stand is provided with a thermal-buffer plate intervening between said compensation heater and the target substrates on said holder to receive heat rays from said compensation heater.

6. An apparatus according to claim 4, further comprising a thermometer attached to said support stand, and a controller for controlling heating power of said compensation heater on the basis of temperatures measured by said thermometer.

7. An apparatus according to claim 1, wherein said compensation heater comprises a light source functioning as heating means, and said lid comprises a transparent window facing said light source.

8. An apparatus according to claim 7, wherein said light source comprises a plurality of heating lamps electrically and individually controllable over their heating power, and a plurality of reflection mirrors respectively surrounding said heating lamps and directed upward.

9. An apparatus according to claim 8, wherein each of said reflection mirrors has a reflection surface of an elliptic shape in section along its optical axis direction.

10. An apparatus according to claim 1, further comprising another compensation heater disposed above said process chamber, for heating the target substrates on said holder from above through a ceiling of said process chamber.

11. A vertical-heat-treatment apparatus for heat-treating a plurality of target substrates all together in a semiconductor process system, comprising:

a process chamber for receiving the target substrates, said process chamber having a port at its bottom end;

a lid for opening and closing said port, said lid being vertically moved to open and close said port;

a holder for holding the target substrates to be vertically stacked with gaps therebetween in said process chamber, said holder being loaded and unloaded into and from said process chamber through said port;

an elevating mechanism for vertically moving said lid along with said holder;

a main heater disposed around said process chamber, for heating an atmosphere in said process chamber through a side wall of said process chamber; and a compensation heater attached to said elevating mechanism and disposed below said lid, for heating the target substrates on said holder from below through said lid, said compensation heater being vertically moved along with said lid by said elevating mechanism, wherein said compensation heater comprises a light source functioning as a heating means, and said lid comprises a transparent window facing said light source, said light source comprises a plurality of heating lamps electrically and individually controllable over their heating power, and a plurality of reflection mirrors respectively surrounding said heating lamps and directed upward, each of said reflection mirrors has a reflection surface of an elliptic shape in section along it optical axis direction, and said apparatus further comprises a rotational mechanism for rotating said reflection mirrors about respective centers of said lamps, such that each of said reflection mirrors has an optical axis inclined from a vertical direction.

12. An apparatus according to claim 11, further comprising a supply mechanism for supplying a process gas into said process chamber and an exhaust mechanism for exhausting and setting said process chamber at a vacuum.

13. An apparatus according to claim 11, wherein said holder is supported by said lid when said holder is loaded in said process chamber.

14. An apparatus according to claim 11, wherein said holder comprises a boat for supporting the target substrates and a support stand for supporting said boat on said lid, said boat and support stand being separable from each other.

15. An apparatus according to claim 14, wherein said support stand is provided with a thermal-buffer plate intervening between said compensation heater and the target substrates on said holder to receive heat rays from said compensation heater.

16. An apparatus according to claim 14, further comprising a thermometer attached to said support stand and a controller for controlling heating power of said compensation heater on the basis of temperatures measured by said thermometer.

17. An apparatus according to claim 11, further comprises another compensation heater disposed above said process chamber, and another compensation heater being configured to heat the target substrates on said holder from above through a ceiling of said process chamber.

* * * * *